United States Patent
Chandrashekar et al.

(10) Patent No.: US 9,034,768 B2
(45) Date of Patent: May 19, 2015

(54) DEPOSITING TUNGSTEN INTO HIGH ASPECT RATIO FEATURES

(75) Inventors: Anand Chandrashekar, Sunnyvale, CA (US); Raashina Humayun, Fremont, CA (US); Michal Danek, Cupertino, CA (US); Aaron R. Fellis, San Jose, CA (US); Sean Chang, Cupertino, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 12/833,823

(22) Filed: Jul. 9, 2010

(65) Prior Publication Data

US 2012/0009785 A1  Jan. 12, 2012

(51) Int. Cl.
| | |
|---|---|
| H01L 21/302 | (2006.01) |
| C23F 4/00 | (2006.01) |
| C23C 16/04 | (2006.01) |
| C23C 16/06 | (2006.01) |
| H01L 21/768 | (2006.01) |

(52) U.S. Cl.
CPC ............... C23F 4/00 (2013.01); C23C 16/045 (2013.01); C23C 16/06 (2013.01); H01L 21/76877 (2013.01)

(58) Field of Classification Search
USPC .......................................... 438/706, 685, 675
See application file for complete search history.

(56) References Cited

U.S. PATENT DOCUMENTS

| | | |
|---|---|---|
| 4,804,560 A | 2/1989 | Shioya et al. |
| 5,037,775 A | 8/1991 | Reisman |
| 5,164,330 A | 11/1992 | Davis et al. |
| 5,489,552 A | 2/1996 | Merchant et al. |
| 5,719,410 A | 2/1998 | Suehiro et al. |

(Continued)

FOREIGN PATENT DOCUMENTS

| | | |
|---|---|---|
| EP | 1 055 746 | 11/2000 |
| JP | H04-56130 | 2/1992 |

(Continued)

OTHER PUBLICATIONS

C.K. Tsang et al, "CMOS-Compatible Through Silicon Vias for 3D Process Integration", Materials Research Society 2007 Symposium Proceedings vol. 970, paper 0970-Y01-01.

(Continued)

*Primary Examiner* — Matthew W Such
*Assistant Examiner* — Ali Naraghi
(74) *Attorney, Agent, or Firm* — Weaver Austin Villeneuve & Sampson LLP

(57) ABSTRACT

Methods and apparatuses for filling high aspect ratio features with tungsten-containing materials are provided. The method involves providing a partially fabricated semiconductor substrate and depositing a tungsten-containing layer on the substrate surface to partially fill one or more high aspect ratio features. The method continues with selective removal of a portion of the deposited layer such that more material is removed near the feature opening than inside the feature. In certain embodiments, removal may be performed at mass-transport limited conditions with less etchant available inside the feature than near its opening. Etchant species are activated before being introduced into the processing chamber and/or while inside the chamber. In specific embodiments, recombination of the activated species is substantially limited and/or controlled during removal, e.g., operation is performed at less than about 250° C. and/or less than about 5 Torr.

21 Claims, 8 Drawing Sheets

(56) References Cited

U.S. PATENT DOCUMENTS

| | | | |
|---|---|---|---|
| 5,747,379 A | 5/1998 | Huang et al. | |
| 5,767,015 A | 6/1998 | Tabara | |
| 5,807,786 A | 9/1998 | Chang | |
| 5,866,483 A | 2/1999 | Shiau et al. | |
| 6,011,311 A | 1/2000 | Hsing et al. | |
| 6,100,193 A | 8/2000 | Suehiro et al. | |
| 6,110,822 A | 8/2000 | Huang et al. | |
| 6,221,754 B1 | 4/2001 | Chiou et al. | |
| 6,245,654 B1 | 6/2001 | Shih et al. | |
| 6,376,376 B1 | 4/2002 | Lim et al. | |
| 6,383,910 B2 | 5/2002 | Okada et al. | |
| 6,432,830 B1* | 8/2002 | Merry | 438/706 |
| 6,593,233 B1 | 7/2003 | Miyazaki et al. | |
| 6,683,000 B2 | 1/2004 | Fukui et al. | |
| 6,696,337 B2 | 2/2004 | Asano et al. | |
| 7,193,369 B2 | 3/2007 | Min et al. | |
| 7,578,944 B2 | 8/2009 | Min et al. | |
| 7,655,567 B1 | 2/2010 | Gao et al. | |
| 7,993,460 B2* | 8/2011 | Steger | 118/728 |
| 8,071,478 B2 | 12/2011 | Wu et al. | |
| 8,119,527 B1 | 2/2012 | Chandrashekar et al. | |
| 8,124,531 B2 | 2/2012 | Chandrashekar et al. | |
| 8,129,270 B1 | 3/2012 | Chandrashekar et al. | |
| 8,153,520 B1 | 4/2012 | Chandrashekar et al. | |
| 8,435,894 B2 | 5/2013 | Chandrashekar et al. | |
| 8,501,620 B2 | 8/2013 | Chandrashekar et al. | |
| 8,835,317 B2 | 9/2014 | Chandrashekar et al. | |
| 2002/0132472 A1 | 9/2002 | Park | |
| 2002/0177325 A1 | 11/2002 | Takewaka et al. | |
| 2003/0082902 A1 | 5/2003 | Fukui et al. | |
| 2003/0190802 A1 | 10/2003 | Wang et al. | |
| 2004/0025091 A1 | 2/2004 | Totman et al. | |
| 2004/0077161 A1* | 4/2004 | Chen et al. | 438/622 |
| 2004/0079632 A1* | 4/2004 | Ahmad et al. | 204/192.3 |
| 2004/0245091 A1* | 12/2004 | Karim et al. | 204/192.12 |
| 2004/0250910 A1 | 12/2004 | Karim et al. | |
| 2005/0031786 A1* | 2/2005 | Lee et al. | 427/255.28 |
| 2005/0179141 A1 | 8/2005 | Yun et al. | |
| 2005/0250316 A1 | 11/2005 | Choi et al. | |
| 2005/0275941 A1 | 12/2005 | Liu et al. | |
| 2006/0075966 A1 | 4/2006 | Chen et al. | |
| 2006/0084269 A1 | 4/2006 | Min et al. | |
| 2006/0094238 A1 | 5/2006 | Levy et al. | |
| 2007/0187362 A1 | 8/2007 | Nakagawa et al. | |
| 2008/0254623 A1 | 10/2008 | Chan et al. | |
| 2009/0053893 A1 | 2/2009 | Khandelwal et al. | |
| 2010/0072623 A1* | 3/2010 | Prindle et al. | 257/763 |
| 2010/0144140 A1 | 6/2010 | Chandrashekar et al. | |
| 2010/0240212 A1 | 9/2010 | Takahashi | |
| 2011/0159690 A1 | 6/2011 | Chandrashekar et al. | |
| 2011/0233778 A1 | 9/2011 | Lee et al. | |
| 2012/0115329 A1 | 5/2012 | Chandrashekar et al. | |
| 2012/0164832 A1 | 6/2012 | Chandrashekar et al. | |
| 2013/0171822 A1 | 7/2013 | Chandrashekar et al. | |
| 2013/0302980 A1 | 11/2013 | Chandrashekar et al. | |
| 2013/0330926 A1 | 12/2013 | Chandrashekar et al. | |
| 2014/0017891 A1 | 1/2014 | Chandrashekar et al. | |

FOREIGN PATENT DOCUMENTS

| | | |
|---|---|---|
| JP | H07-094488 | 4/1995 |
| JP | H07-226393 | 8/1995 |
| JP | H09-326436 | 12/1997 |
| JP | 10-178014 A | 6/1998 |
| JP | 2001-007048 | 1/2001 |
| JP | 2001-274114 | 10/2001 |
| JP | 2002-009017 | 1/2002 |
| JP | 2002-305162 | 10/2002 |
| JP | 2003-142484 | 5/2003 |
| JP | 2007-251164 | 9/2007 |
| JP | 2010-225697 | 10/2010 |
| KR | 10-2003-0058853 | 7/2003 |
| KR | 10-2004-0087406 | 10/2004 |
| KR | 10-2005-0011479 | 1/2005 |
| KR | 10-2005-0013187 | 2/2005 |
| KR | 10-2006-0087844 | 8/2006 |
| KR | 10-2010-0067065 | 8/2006 |
| KR | I201074 | 11/2012 |
| TW | 557503 | 10/2003 |
| WO | WO 2013/148444 | 10/2013 |
| WO | WO 2013/148880 | 10/2013 |

OTHER PUBLICATIONS

U.S. Patent Application entitled, "Depositing Tungsten Into High Aspect Ratio Features", U.S. Appl. No. 12/535,464, filed Aug. 4, 2009.

U.S. Patent Application entitled, "Thinning Tungsten Layer After Through Silicon Via Filling", U.S. Appl. No. 12/534,566, filed Aug. 3, 2009.

U.S. Patent Application entitled, "Method for Depositing Tungsten Film Having Low Resistivity, Low Roughness and High Reflectivity", U.S. Appl. No. 12/332,017, filed Dec. 10, 2008.

U.S. Patent Application entitled, "Methods for Depositing Tungsten Films Having Low Resistivity for Gapfill Applications", U.S. Appl. No. 12/535,377, filed Aug. 5, 2009.

U.S. Office Action for U.S. Appl. No. 12/332,017, mailed Dec. 30, 2009.

Final Office Action for U.S. Appl. No. 12/332,017 mailed Jul. 26, 2010.

U.S. Office Action for U.S. Appl. No. 12/535,464 mailed Sep. 13, 2010.

U.S. Office Action for U.S. Appl. No. 12/332,017 mailed Nov. 15, 2010.

U.S. Office Action for U.S. Appl. No. 12/535,377 mailed Nov. 1, 2010.

U.S. Patent Application entitled, "Depositing tungsten into high aspect ratio features", U.S. Appl. No. 13/016,656, filed Jan. 28, 2011.

U.S. Final Office Action for U.S. Appl. No. 12/202,126 mailed Feb. 7, 2011.

U.S. Final Office Action for U.S. Appl. No. 12/535,464 mailed Apr. 14, 2011.

U.S. Office Action for U.S. Appl. No. 12/535,377 mailed Jun. 14, 2011.

U.S. Final Office Action for U.S. Appl. No. 12/332,017 mailed Jul. 22, 2011.

U.S. Office Action for U.S. Appl. No. 12/535,464 mailed Jul. 28, 2011.

U.S. Office Action for U.S. Appl. No. 12/534,566 mailed Sep. 2, 2011.

Dimensions of Wafer as described by Wikepedia, 2008.

Deposition Process, Oxford Electronics, 1996.

KR patent application No. 10-2009-0122292, Office Action mailed Aug. 29, 2011.

Korean Patent Abstracts, Publication No. 1020030035877, published May 9, 2003, downloaded from http://kpa.kipris.or.kr/kpa2010 on Aug. 29, 2011.

Office Action mailed Oct. 12, 2011 from U.S. Appl. No. 12/535,464.

Office Action mailed Nov. 25, 2011 from U.S. Appl. No. 13/016,656.

Notice of Allowance mailed Oct. 28, 2011 from U.S. Appl. No. 12/332,017.

Final Office Action mailed Dec. 1, 2011 from U.S. Appl. No. 12/535,377.

Notice of Allowance mailed Dec. 20, 2011 from U.S. Appl. No. 12/534,566.

Notice of Allowance mailed Dec. 30, 2011 from U.S. Appl. No. 12/535,464.

Notice of Allowance mailed Jan. 9, 2012 from U.S. Appl. No. 13/016,656.

Examination and Search Report for Application No. 201005237-1, mailed Dec. 14, 2011.

U.S. Office Action for U.S. Appl. No. 13/351,970 mailed Mar. 27, 2012.

KR patent application No. 10-2009-0122292, Office Action issued Jun. 26, 2012.

US Office Action dated Mar. 7, 2013 issued in U.S. Appl. No. 12/535,377.

(56) References Cited

OTHER PUBLICATIONS

US Office Action dated Nov. 23, 2012 issued in U.S. Appl. No. 13/412,534.
US Notice of Allowance dated Apr. 8, 2013, issued in U.S. Appl. No. 13/412,534.
US Final Office Action dated Sep. 11, 2012 issued in U.S. Appl. No. 13/351,970.
US Notice of Allowance dated Jan. 9, 2013 issued in U.S. Appl. No. 13/351,970.
Office Action mailed Nov. 6, 2012, issued in KR Appl. No. 2012-0104518.
Office Action mailed Sep. 12, 2012 issued in KR Appl. No. 2012-0104518.
US Final Office Action dated Oct. 7, 2013 issued in U.S. Appl. No. 12/535,377.
US Office Action dated Jan. 6, 2014 issued in U.S. Appl. No. 13/888,077.
KR Provisional Rejection dated Nov. 16, 2012, issued in Korean Appl. No. 2011-0068603.
PCT International Search Report and Written Opinion, dated Jun. 28, 2013, issued in PCT/US2013/033174.
PCT International Search Report and Written Opinion, dated Jul. 26, 2013, issued in PCT/US2013/034167.
U.S. Patent Application entitled, "Void Free Tungsten Fill in Different Sized Features", U.S. Appl. No. 14/341,646, filed Jul. 25, 2014.
U.S. Appl. No. 14/502,817, filed Sep. 30, 2014, entitled "Tungsten Feature Fill."
US Office Action dated Apr. 11, 2014 issued in U.S. Appl. No. 13/934,089.
US Office Action dated Nov. 12, 2014 issued in U.S. Appl. No. 13/934,089.
US Notice of Allowance, dated May 12, 2014 issued in U.S. Appl. No. 13/888,077.
JP Office Action dated Mar. 11, 2014 issued in Japanese Appl. No. 2009-278990.
TW Office Action dated Mar. 27, 2014, issued in Taiwan Appl. No. 098142115.
TW Office Action (Decision) dated Oct. 13, 2014, issued in Taiwan Appl. No. 098142115.
JP Office Action dated Feb. 25, 2014 issued in Japanese Appl. No. 2009-292610.
TW Office Action dated Apr. 29, 2014, issued in Taiwan Appl. No. 098146010.
PCT International Preliminary Report on Patentaiblity and Written Opinion, dated Oct. 9, 2014, issued in PCT/US2013/033174.
PCT International Preliminary Report on Patentability and Written Opinion, dated Oct. 9, 2014, issued in PCT/US2013/034167.
Chen et al., (Aug. 2003) "Advances in Remote Plasma Sources for Cleaning 300 mm and Flat Panel CVD Systems," Semiconductor Magazine, 6 pp.
Rosner et al., (1971) "Kinetics of the attack of refractory solids by atomic and molecular fluorine," The Journal of Physical Chemistry, 75(3):308-317.

\* cited by examiner

DEPOSITING TUNGSTEN INTO HIGH ASPECT RATIO FEATURES

BACKGROUND

Deposition of tungsten-containing materials using chemical vapor deposition (CVD) techniques is an integral part of many semiconductor fabrication processes. These materials may be used for horizontal interconnects, vias between adjacent metal layers, contacts between first metal layers and devices on the silicon substrate, and high aspect ratio features. In a conventional deposition process, a substrate is heated to a predetermined process temperature in a deposition chamber, and a thin layer of tungsten-containing materials that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing tungsten-containing materials into small and, especially, high aspect ratio features may cause formation of seams (e.g., unfilled voids) inside the filled features. Large seams may lead to high resistance, contamination, loss of filled materials, and otherwise degrade performance of integrated circuits. For example, a seam may extend close to the field region after filling process and then open during chemical-mechanical planarization.

SUMMARY

Methods and apparatuses for filling high aspect ratio features with tungsten-containing materials are provided. The method involves providing a partially fabricated semiconductor substrate and depositing a tungsten-containing layer on the substrate surface to partially fill one or more high aspect ratio features. The method continues with selective removal of a portion of the deposited layer such that more material is removed near the feature opening than inside the feature. In certain embodiments, removal may be performed at mass-transport limited conditions with less etchant available inside the feature than near its opening. Etchant species are activated before being introduced into the processing chamber and/or while inside the chamber. In specific embodiments, recombination of the activated species is substantially limited and/or etching with such recombined species is controlled during removal, e.g., operation is performed at less than about 250° C. and/or less than about 5 Torr. This in turn provides better a control of selective removal of the deposited layer.

In certain embodiments, a method of filling a high aspect ratio feature provided on a partially manufactured semiconductor substrate involves introducing a tungsten-containing precursor and a reducing agent into a processing chamber and depositing a layer of a tungsten-containing material on the partially manufactured semiconductor substrate via a chemical vapor deposition reaction between the tungsten-containing precursor and the reducing agent. This layer partially fills the high aspect ratio feature. The method proceeds with introducing an activated etching material into the processing chamber and selectively removing a portion of the deposited layer using the activated etching material at process conditions that substantially limit recombination of the activated etching material. In certain embodiment, these process conditions include a temperature of the substrate of less than about 250° C. and a pressure of the processing chamber of less than 5 Torr. More specifically, the temperature may be less than about 150° C. or even less than about 100° C. In the same or other embodiments, the pressure of the processing chamber is less than 2 Torr or even less than 1 Torr.

In certain embodiments, a reduction near the feature opening is at least about 25% greater than the reduction inside the feature. A high-aspect ratio feature may have an aspect ratio of at least about 2. In certain embodiments, an etchant is introduced into the chamber at a flow rate corresponding to a mass transport regime. An etchant is introduced into the processing chamber from a remote plasma generator configured to generate the activated etching material. In certain embodiments, a deposition operation and a selective removal operation are performed in different chambers maintained at different environmental conditions.

In certain embodiments, a method further involves repeating a deposition operation to form a second deposited layer and repeating a selective removal operation to form a second etched layer. The repeated selective removal operation may be performed at different process conditions than the prior selective removal operation. In certain embodiments, a reduction in average thickness of the second deposited layer near the opening is greater than the reduction in the average thickness of the second deposited layer inside the feature by at least about 10%.

In certain embodiments, a method further involves depositing a tungsten-containing material on a substrate via a chemical vapor deposition reaction between a tungsten-containing precursor and a reducing agent until a high aspect ratio feature is closed. The closed high aspect ratio feature may have a seam that ends at least about 20% from a field region relative to the depth of the high aspect ratio feature. In certain embodiments, a substrate has a second feature that is closed during the deposition and remains closed after the selective removal. In the same or other embodiments, a high aspect ratio feature is closed during the deposition and opens during the selective removal.

In certain embodiments, a method of filling a high aspect ratio feature provided on a partially manufactured semiconductor substrate involves depositing in a first processing chamber a layer of a tungsten-containing material on the partially manufactured semiconductor substrate via a chemical vapor deposition reaction between a tungsten-containing precursor and a reducing agent introduced. The layer partially fills the high aspect ratio feature. The method continues with moving the partially manufactured semiconductor substrate with the deposited layer of the tungsten-containing material into a second processing chamber. The second processing chamber has different environmental conditions than the first processing chamber. The method proceeds with selectively removing in the second processing chamber a portion of the deposited layer forming an etched layer using an activated etching material at process conditions that substantially prevent recombination of the activated etching material. In certain embodiments, removing is performed while the second processing chamber is kept at less than about 5 Torr and the partially manufactured semiconductor substrate is kept at less than about 250° C. An average thickness of the etched layer near the opening is less than the average thickness of the etched layer inside the feature. The method proceeds with depositing additional tungsten-containing material over the etched layer until the high aspect ratio feature is closed.

In certain embodiments, a semiconductor processing apparatus for filling a high aspect ratio feature on a partially manufactured semiconductor substrate includes a first processing chamber having one or more deposition stations for positioning the substrate and configured for depositing a layer of a tungsten-containing material on the partially manufactured semiconductor substrate via a chemical vapor deposition reaction a second processing having one or more etching stations for positioning the substrate and configured for selectively removing a portion of the deposited layer. Deposition stations and/or etching stations include one or more heating elements for controlling the substrate temperature during deposition and/or etching. An apparatus may include a controller with program instructions for introducing a tungsten-containing precursor and a reducing agent into the first processing chamber, depositing a layer of the tungsten-containing material on the partially manufactured semiconductor substrate via the chemical vapor deposition reaction between the tungsten-containing precursor and the reducing agent, such that the layer partially fills the high aspect ratio feature, introducing a tungsten-containing precursor and a reducing agent into the first processing chamber, introducing an activated etching material into the second processing chamber, and selectively removing a portion of the deposited layer using an activated etching material at process conditions that substantially prevent recombination of the activated etching material.

These and other aspects of the invention are further described in more detail with reference to the corresponding drawings.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.
Introduction Filling features with tungsten-containing materials may cause formation of seams inside the filled features. A seam can form when a layer that is being deposited on the side walls of the feature thickens to the point that it seals off (i.e., forms a pinch point, also referred to as a sealing point) a void space below this point from the environment of the processing chamber. In the other words, thickening of the deposited layer pinches off a void space. This pinching prevents precursors and/or other reactants from entering remaining void spaces, and they remain unfilled. A void space is typically an elongated seam extending throughout a portion of the filled feature along the feature's depth direction. This void space or seam is also sometimes referred to as a keyhole because of its shape.

Figure 1:
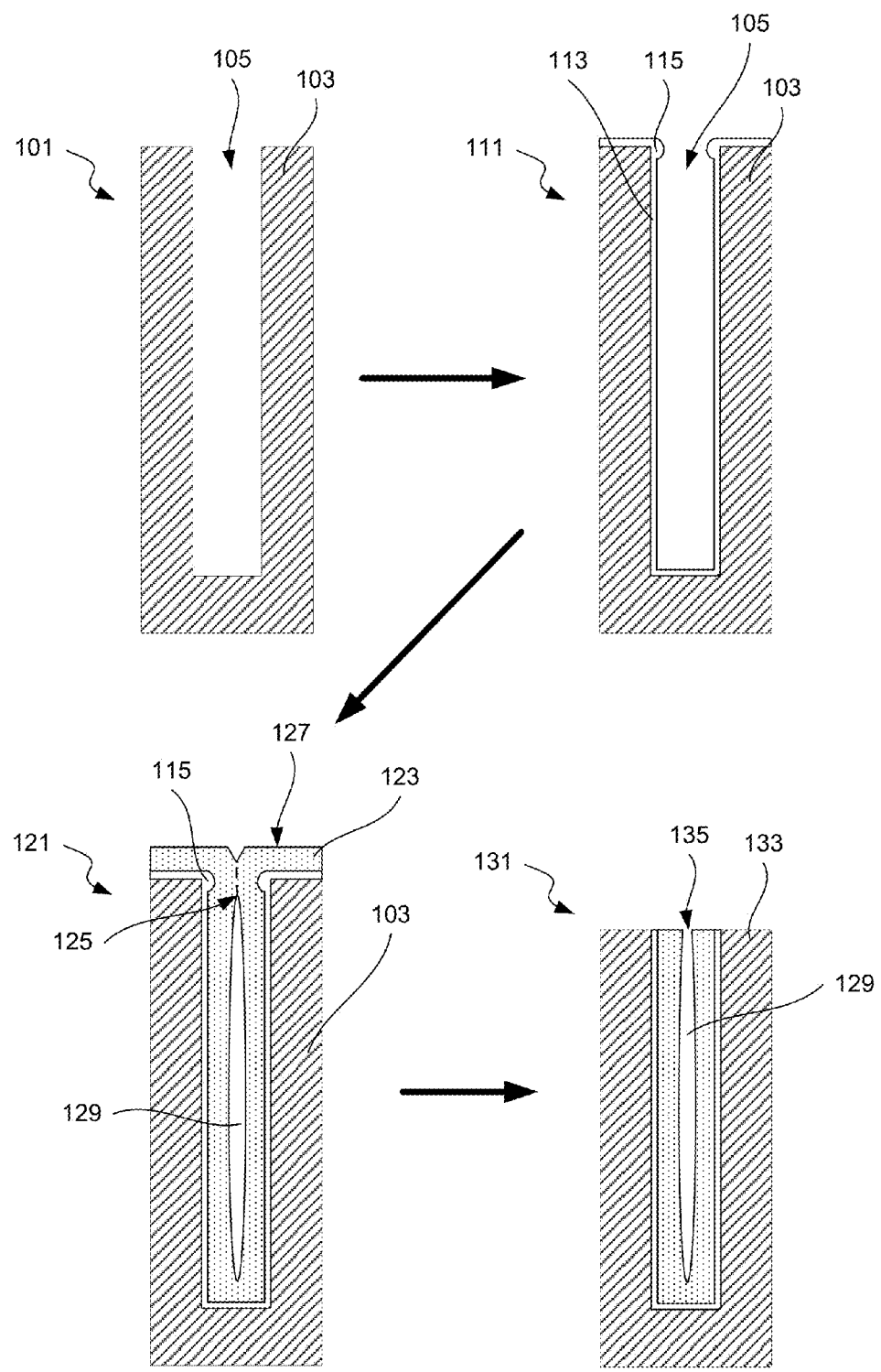
FIG. 1 illustrates an example of a semiconductor substrate containing a high aspect ratio feature at different stages of a process in accordance with certain embodiments.

There are multiple potential causes for seam formation. One is an overhang formed near the feature opening during deposition of tungsten-containing materials or, more typically, other materials, such as a diffusion barrier layer or a nucleation layer. FIG. 1 illustrates an example of a semiconductor substrate containing a high aspect ratio feature during different stages of semiconductor processing in accordance with certain embodiments. The first cross-section 101 shows a substrate 103 with a pre-formed feature hole 105. The substrate may be a silicon wafer, e.g., 200-mm wafer, 300-mm wafer, 450-mm wafer. The feature hole 105 may have an aspect ratio of at least about 2:1 or, in more specific embodiments, of at least about 4:1. The features hole 105 may also have a cross-section dimension near the opening (e.g., opening diameter, line width, etc.) of between about 10 nanometers to 500 nanometers, or more specifically between about 25 nanometers to 300 nanometers. The feature hole is sometimes referred to as an unfilled feature or simply a feature.

In the next stage (cross-section 111), the substrate 103 is shown with a deposited an under-layer 113 lining the feature hole 105, which may be a diffusion barrier layer, an adhesion layer, a nucleation layer, a combination of thereof, or any other applicable material. Because many deposition processes do not have good step coverage properties, i.e., more material is deposited on the field region and near the opening than inside the feature, the under-layer 113 may form an overhang 115. While the overhang 115 is a part of the under-layer 113, the layer 113 may be thicker near the opening than, for example, inside the feature. For the purposes of this description, "near the opening" is defined as an approximate position or an area within the feature (i.e., along the side wall of the feature) corresponding to between about 0-10% of the feature depth measured from the field region. In certain embodiments, the area near the opening corresponds to the area at the opening. Further, "inside the feature" is defined as an approximate position or an area within the feature corresponding to between about 20-60% of the feature depth measured from the field region on the top of the feature. Typically, when values for certain parameters (e.g., thicknesses) are specified "near the opening" or "inside the feature", these values represent a measurement or an average of multiple measurements taken within these positions/areas. In certain embodiments, an average thickness of the under-layer near the opening is at least about 10% greater than that inside the feature. In more specific embodiments, this difference may be at least about 25%, at least about 50%, or at least about 100%.

Distribution of a material within a feature may also be characterized by its step coverage. For the purposes of this description, "step coverage" is defined as a ratio of two thicknesses, i.e., the thickness of the material inside the feature divided by the thickness of the material near the opening. In certain examples, the step coverage of the under-layer is less than about 100% or, more specifically, less than about 75% or even less than about 50%.

The next cross-section 121 illustrates the feature hole filled with the tungsten-containing materials 123. A deposition process may result in a conformal layer of the materials 123 built-up over the under-layer 113. This deposited layer follows the shape of the under-layer 113 including its overhang 115. In certain embodiments and, particularly, in later stages of the deposition process (e.g., right before feature closing), the layer 123 may become less conformal resulting in poor step coverage (i.e., more material being deposited near the opening than inside the feature). As the layer 123 thickens, it may close the feature forming a pinch point 125. Often some additional material is deposited above the pinch point 125 before the deposition process is stopped. Because of the overhang 115 and, in certain embodiments, the poor step coverage of the layer 123, the closed feature may have an unfilled void 129 (i.e., a seam) below the reference point 125. The size of the void 129 and the position of the reference point 125 with respect to the field region 127 depend on the size of the overhang 115, as well as the size, aspect ratio, and bowing of the feature, deposition process parameters, and other parameters.

Finally, cross-section 131 shows the substrate 133 after chemical-mechanical planarization (CMP), which removes a top layer from the substrate 103. CMP may be used to remove an overburden from the field region, such as parts of layers 113 and 123 that were present on the top surface of the substrate 103. Typically the substrate 103 is also thinned down during CMP to form the substrate 133. If the pinch point 125 falls above the planarization level of the CMP process, as in FIG. 1, the seam 129 opens up and is exposed to environment through the seam opening 135. The problems with open and large seams are described above.

Another cause that is not illustrated in FIG. 1 but that nevertheless may lead to seam formation or enlarging seams and moving the reference point closer to the field region is curved (or bowed) side walls of feature holes, which are also referred to as bowed features. In a bowed feature the cross-sectional dimension of the cavity near the opening is smaller than that inside the feature. Effects of these narrower openings in the bowed features are somewhat similar to the overhang problem described above. Further, bowed features may also have under-layers with overhangs and encounter other seam formation causes compounding negative effects of seam formation.

Complete eliminations of seams from the features filled with tungsten-containing materials may not be possible or practical. Some void spacing may remain inside the features, for example, due to large grains of the deposited materials, mass transport limitations during deposition, especially before feature closing, and other reasons. However, novel methods are presented herein that allow reducing seam sizes and moving reference points further away from the field region. These are collectively referred to as mitigating seam formation.

Process

It has been found that seam formation can be mitigated or, in some embodiments, eliminated by introducing one or more intermediate selective removal operations. For example, a filling process may start with forming an initial layer that at least partially fills a high aspect ratio feature. This operation is followed by partial selective removal of this initial layer and then depositing an additional layer. This removal-deposition cycle may be repeated until the feature is completely filled in a substantially void free manner. Process parameters may be selected such that the step coverage is improved at least one cycle. In certain embodiments, each cycle further improves the step coverage. Overall, selective removal can be characterized by more material removed near the opening than inside the feature. Various process control parameters may be employed to achieve these results including removal at mass-transport limiting conditions, controlling removal and/or adsorption rates of different etching components (e.g., activated and recombined species), controlling recombination rates of etching species, and others. For the purposes of this application, activated species, such as atomized species, radicals, and ions (e.g., atomic fluorine), are distinguished from recombined species, such as molecules including high energy state molecules (e.g., molecular fluorine), and from initial etchant species (e.g., nitrogen tri-fluoride and other precursors further described below).

Figure 2:
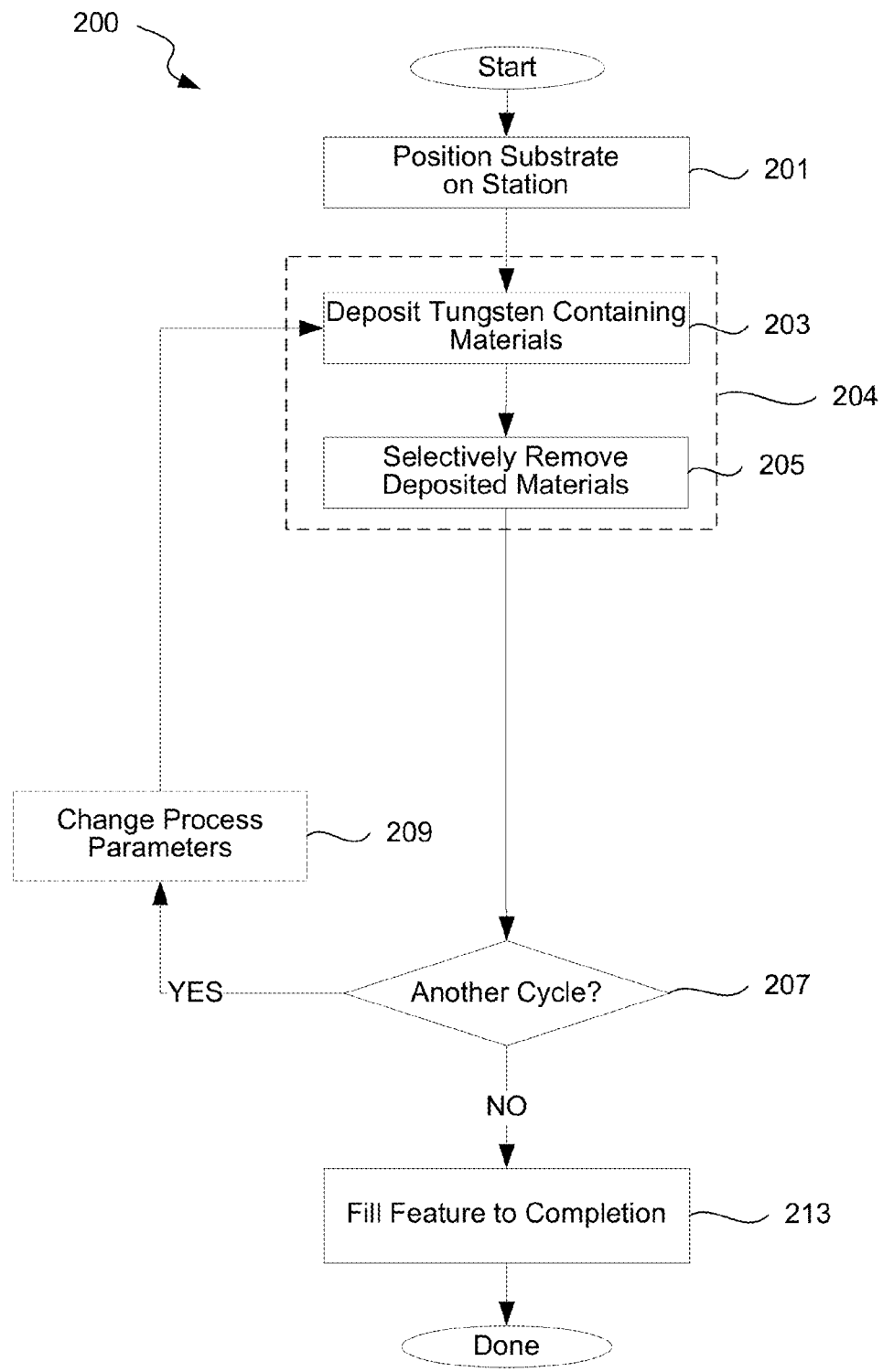
FIG. 2 illustrates a general process flowchart representing a method of filling high aspect ratio features with tungsten-containing materials in accordance with certain embodiments.

FIG. 2 illustrates a general process flowchart representing a method of filling high aspect ratio features with tungsten-containing materials in accordance with certain embodiments. A process 200 may start with positioning a substrate containing high aspect ratio features on a deposition station inside the processing chamber (block 201). The substrate may also have an under-layer, such as a diffusion barrier layer and/or tungsten nucleation layer. Certain substrate and under-layer details are provided above in the context of FIG. 1. In certain embodiments, an average thickness of an under-layer near the feature opening is at least about 25% greater than that inside the feature (e.g., near the bottom of the feature). In a more general sense, a substrate may have an under-layer that formed overhangs. In some cases, a layer of previously deposited bulk tungsten may be present in the feature. Features with overhangs are more prone to form voids during filling.

A diffusion barrier layer may be previously deposited onto the substrate to form a conformal layer that prevents diffusion of materials used to fill the features into surrounding materials of the substrate. Materials for the diffusion barrier layer may include tungsten nitride, titanium, titanium nitride, and others. The barrier layer may be between about 10 Angstroms and 500 Angstroms thick or, in more specific embodiments, between about 25 Angstroms and 200 Angstroms thick. In certain embodiments, a diffusion barrier layer is unevenly distributed on the substrate surface such that it forms overhang.

A nucleation layer is typically a thin conformal layer that facilitates subsequent deposition of bulk tungsten-containing material thereon. In certain embodiments, the nucleation layer is deposited using a pulsed nucleation layer (PNL) technique. In a PNL technique, pulses of the reducing agent, purge gases, and tungsten-containing precursors are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. patent application Ser. Nos. 12/030,645 filed on Feb. 13, 2008, U.S. patent application Ser. No. 11/951,236, filed Dec. 5, 2007, and U.S. patent application Ser. No. 12/407,541, filed on Mar. 19, 2009, all of which are incorporated by reference herein its entirety for the purposes of describing tungsten deposition process. Additional discussion regarding PNL type processes can be found in U.S. Pat. Nos. 6,635,965, 6,844,258, 7,005,372 and 7,141,494 as well as in U.S. patent application Ser. No. 11/265,531, also incorporated herein by reference. In certain embodiments, a nucleation layer is unevenly distributed on the substrate surface such that it forms overhang. The methods described herein are not limited to a particular method of tungsten nucleation layer deposition, but include deposition of bulk tungsten film on tungsten nucleation layers formed by any method including PNL, ALD, CVD, PVD and any other method. Moreover, in certain embodiments, bulk tungsten may be deposited directly without use of a nucleation layer.

The deposition station may be also used to perform certain prior operations (e.g., deposition of a diffusion barrier layer, deposition of a nucleation layer) and/or subsequent operations (e.g., etching, another deposition, final feature filling). In certain embodiments, the deposition station may be specifically designated to perform deposition operation 203. The apparatus may also include additional deposition stations to perform the operation 203. For example, an initial deposition may be performed on the first deposition station. The substrate may be then moved to another station for etching. In certain embodiments further described below, an etching station is positioned in a different chamber to prevent cross-contamination between deposition and etching environments that use different materials and conditions for their respective operations. If the process then requires another deposition operation 203, the substrate may be returned back to the first deposition station or moved to another deposition station. Multiple deposition stations may be also used to perform parallel deposition operation 203 on several substrates. Additional details and apparatus embodiments are explained below in the context of FIG. 4 and FIGS. 5A-B.

The process may proceed with deposition of tungsten-containing materials onto the substrate (block 203). In certain embodiments, bulk deposition involves a chemical vapor deposition (CVD) process in which a tungsten-containing precursor is reduced by hydrogen to deposit tungsten. While tungsten hexafluoride ($WF_6$) is often used, the process may be performed with other tungsten precursors, including, but not limited to, tungsten hexachloride ($WCl_6$), organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten). In addition, while hydrogen is generally used as the reducing agent in the CVD deposition of the bulk tungsten layer, other reducing agents including silane may be used in addition or instead of hydrogen without departing from the scope of the invention. In another embodiment, tungsten hexacarbonyl ($W(CO)_6$) may be used with or without a reducing agent. Unlike with the PNL processes described above, in a CVD technique, the $WF_6$ and $H_2$ or other reactants are simultaneously introduced into the reaction chamber. This produces a continuous chemical reaction of mix reactant gases that continuously forms tungsten film on the substrate surface. Methods of depositing tungsten films using chemical vapor deposition (CVD) are described in U.S. patent application Ser. No. 12/202,126 filed Aug. 29, 2008, which is incorporated herein its entirety for the purposes of describing deposition processes. According to various embodiments, the methods described herein are not limited to a particular method of partially filling a feature but may include any appropriate deposition technique.

Figure 3:
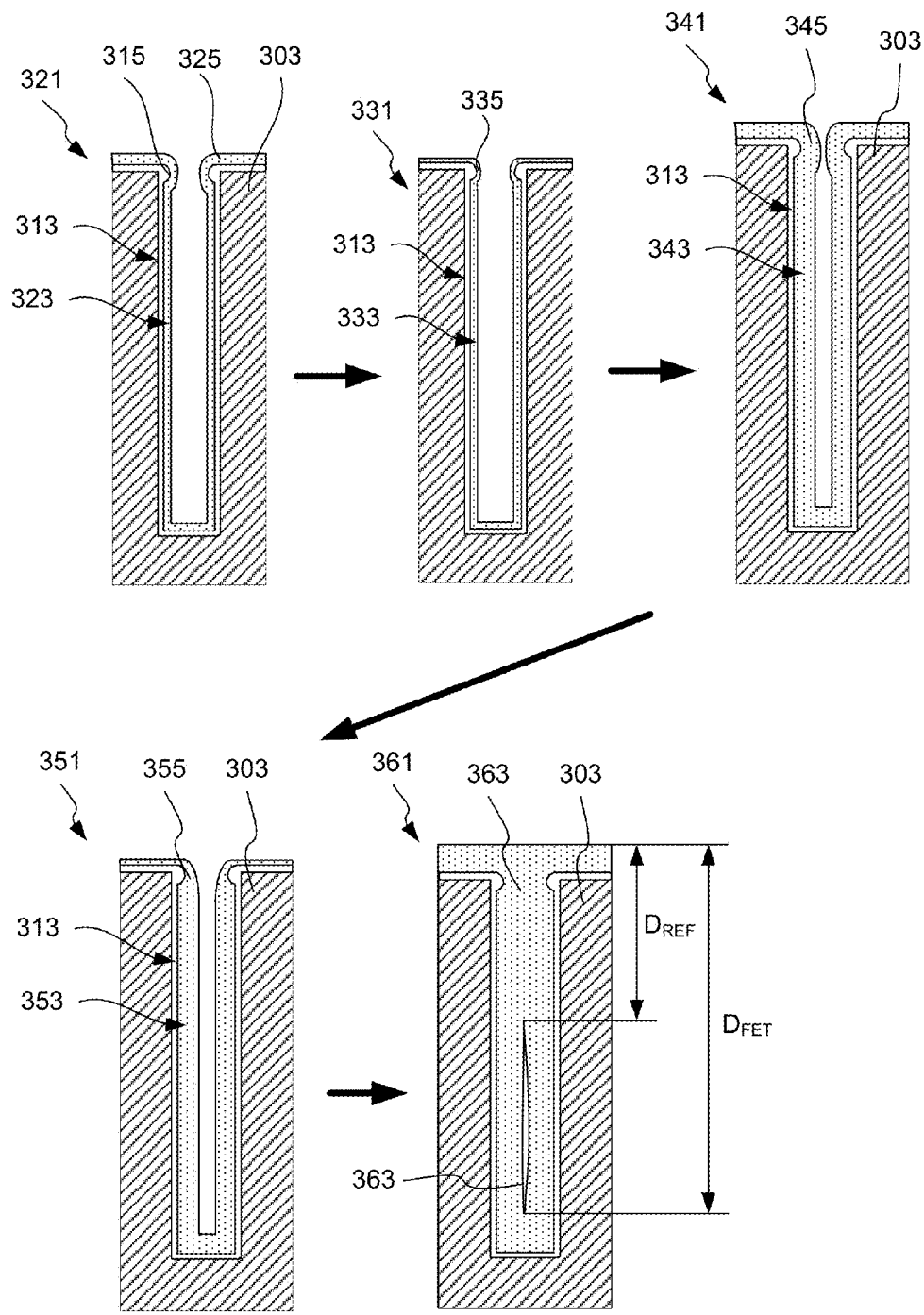
FIG. 3 illustrates schematic representations of substrate cross-sections at different stages of a filling process in accordance with certain embodiments.

FIG. 3 illustrates schematic representations of one example of the features' cross-sections at different stages of a filling process. Specifically, cross-section 321 represents an example of the feature after completing one of the initial deposition operations 203. At this stage of the process, substrate 303 may have a layer 323 of tungsten-containing materials deposited over under-layer 313. The size of the cavity near the opening may be narrower that inside the feature, for example, due to overhang 315 of the under-layer 313 and/or poor step coverage of the deposited layer 323, which are described in more detail above in the context of FIG. 1.

Returning to FIG. 2, the deposition operation 203 proceeds until the deposited layer (e.g., the layer 323) reaches a certain thickness. This thickness may depend on the cavity profile and opening size. In certain embodiments, the average thickness of the deposited layer near the opening may be between about 5% and 25% of the feature cross-sectional dimension including any under-layers, if ones are present. In other embodiments, the feature may be completely closed during the deposition operation 203 and then later re-opened during the selective removal operation (not shown).

In certain embodiments, a process chamber may be equipped with various sensors to perform in-situ metrology measurements to identify the extent of the deposition operation 203 and the removal operation 205. Examples of in-situ metrology include optical microscopy and X-Ray Fluorescence (XRF) for determining thickness of deposited films. Further, infrared (IR) spectroscopy may be used to detect amounts of tungsten fluorides (WFx) generated during etching operation. Finally, an under-layer, such as tungsten nucleation layer or a diffusion barrier layer, may be used as an etch-stop layer.

The process continues with a selective removal operation 205. Certain details of etching processes are described in U.S. patent application Ser. No. 12/535,377, entitled "METHOD FOR DEPOSITING TUNGSTEN FILM HAVING LOW RESISTIVITY, LOW ROUGHNESS AND HIGH REFLECTIVITY" by Chandrashekar et al., filed Aug. 4, 2009, which is incorporated herein in its entirety. The substrate may be moved from the deposition station to another station and, in more specific embodiment, another processing chamber with operating at different conditions, may continue being processed on the same station, or may be first removed from the deposition station (e.g., for storage) and then returned back to the deposition station for the selective removal of the deposited layer.

One way to achieve selective removal (i.e., to remove more deposited material near the opening than inside the feature) is to perform operation 205 in a mass transport limited regime. In this regime, the removal rate inside the feature is limited by amounts of and/or relative compositions of different etching material components (e.g., an initial etchant material, activated etchant species, and recombined etchant species) that diffuse into the feature. In certain examples, etching rates depend on various etchant components' concentrations at different locations inside the feature. It should be noted that the terms "etching" and "removal" are used interchangeably in this document. It should be understood that selective removal could be performed using any removal techniques, which includes etching as well as other techniques.

Mass transport limiting conditions may be characterized, in part, by overall etchant concentration variations. In certain embodiments, this concentration is less inside the feature than near its opening resulting in a higher etching rate near the opening than inside. This in turn leads to selective removal. Mass transport limiting process conditions may be achieved by supplying limited amounts of etchant into the processing chamber (e.g., use low etchant flow rates relative to the cavity profile and dimensions), while maintaining relative high etching rates in order to consume some etchant as it diffuses into the feature. In certain embodiment, a concentration gradient is substantial, which may be caused relatively high etching kinetics and relative low etchant supply. In certain embodiments, an etching rate near the opening may also be mass limited, but this condition is not required to achieve selective removal.

In addition to the overall etchant concentration variations inside high aspect ratio features, selective removal may be influenced by relative concentrations of different etchant components throughout the feature. These relative concentrations in turn depend by relative dynamics of dissociation and recombination processes of the etching species. As further described below, an initial etchant material is typically passed through a remote plasma generator and/or subjected to an in-situ plasma in order to generate activated etchant species (e.g., fluorine atoms, radicals). However, activated specifies tend to recombine into less active recombined etching species (e.g., fluorine molecules) and/or react with tungsten-containing materials along their diffusion paths. As such, different parts of the deposited tungsten-containing layer may be exposed to different concentrations of different etchant materials, e.g., an initial etchant, activated etchant species, and recombined etchant species. This provides additional opportunities for controlling selective removal as described below.

For example, activated fluorine species are generally more reactive with tungsten-containing materials than initial etching materials and recombined etching materials. Furthermore, as evident from FIG. 7, the activated fluorine species are generally less sensitive to temperature variations than the recombined fluorine species. Therefore, process conditions may be controlled in such a way that removal is predominantly attributed to activated fluorine species. Furthermore, specific process conditions may result in activated fluorine species being present at higher concentrations near features' openings than inside the features. For example, some activated species may be consumed (e.g., react with deposited materials and/or adsorbed on its surface) and/or recombined while diffusing deeper into the features, especially in small high aspect ratio features. It should be noted that recombination of activated species also occurs outside of high aspect ratio features, e.g., in the showerhead of the processing chamber, and depends on a chamber pressure. Therefore, a chamber pressure may be specifically controlled to adjust concentrations of activated etching species at various points of the chamber and features. These and other process conditions will now be described in more detail.

In certain embodiments, selective removal operation 205 involves introducing an initial etchant material into the processing chamber and using it to selectively remove the deposited layer. An etchant selection depends on a deposited material. While this description focuses on tungsten containing materials, such as tungsten and tungsten nitride, it should be understood that other materials may be used for partial or complete filling of high aspect ratio features. Some example of these materials include such as titanium, titanium nitride, tantalum, tantalum nitride, ruthenium, and cobalt. These materials can be deposited using Physical Vapor Deposition (PVD), Chemical Vapor Deposition (CVD), Atomic Layer Deposition (ALD), and other deposition techniques. In general, operation 205 may be used to selectively remove any materials formed inside high aspect ratio features, including diffusion barrier layers, nucleation layers, and/or filling materials.

Example of initial etchant materials that can be used for selective removal of tungsten containing materials and some other materials include nitrogen tri-fluoride ($NF_3$), tetrafluoro-methane ($CF_4$), tetrafluoroethylene ($C_2F_4$), hexafluoroethane ($C_2F_6$), and octafluoropropane ($C_3F_8$), tri-fluoromethane ($CHF_3$), sulfur hexafluoride ($SF_6$), and molecular fluorine ($F_2$). A process typically involves generating activate species, e.g., including radicals, ions, and/or high energy molecules. For example, an initial material may be flown through a remote plasma generator and/or subjected to an in-situ plasma.

Flow rates of the etchant typically depend on a size of the chamber, etching rates, etching uniformity, and other parameters. Typically, a flow rate is selected in such a way that more tungsten-containing material is removed near the opening than inside the feature. In certain embodiments, these flow rates cause mass-transport limited selective removal. For example, a flow rate for a 195-liter chamber per station may be between about 25 sccm and 10,000 sccm or, in more specific embodiments, between about 50 sccm and 1,000 sccm. In certain embodiments, the flow rate is less than about 2,000 sccm, less than about 1,000 sccm, or more specifically less than about 500 sccm. It should be noted that these values are presented for one individual station configured for processing a 300-mm wafer substrate. A person having ordinary skills in the art would understand that, for example, these flow rates can be scaled up or down depending on a substrate size, a number of stations in the apparatus (e.g., quadruple for a four station apparatus), a processing chamber volume, and other factors.

In certain embodiments, the substrate needs to be heated up or cooled down before the removal operation 205 can proceed. Various devices may be used to bring the substrate to the predetermined temperature, such as a heating or cooling element in a station (e.g., an electrical resistance heater installed in a pedestal or a heat transfer fluid circulated through a pedestal), infrared lamps above the substrate, igniting plasma, etc.

A predetermined temperature for the substrate is selected in such a way to not only induce a chemical reaction between the deposited layer and various etchant species but also to control the rate of the reaction between the two. For example, a temperature may be selected to have high removal rates such that more material is removed near the opening than inside the feature. Furthermore, a temperature may be also selected to control recombination of activated species (e.g., recombination of atomic fluorine into molecular fluorine) and/or control which species (e.g., activated or recombined species) contribute predominantly to etching. Overall, the substrate temperature may be selected based on etchant chemical compositions, a desired etching rate, desired concentration distributions of activated species, desired contributions to selective removal by different species, and other material and process parameters. In certain embodiments, a substrate is maintained at less than about 300° C., or more particularly at less than about 250° C., or less than about 150° C., or even less than about 100° C. In other embodiments, a substrate is heated to between about 300° C. and 450° C. or, in more specific embodiments, to between about 350° C. and 400° C. Other temperature ranges may be used for different types of etchants.

It has been determined that activated species provide not only faster but also more desirable selective removal than their recombined counterparts. As such, various approaches have been developed to increase relative concentrations and/or removal contributions of the activated species. For example, activation energy of activated fluorine species is much less than that of the recombined fluorine. Therefore, lowering substrate temperatures may result in more removal contribution from activated species. At certain temperatures (and other process conditions, e.g., flow rates and chamber pressures), a relative removal contribution of the activated species may exceed that of the recombined species.

Figure 7:
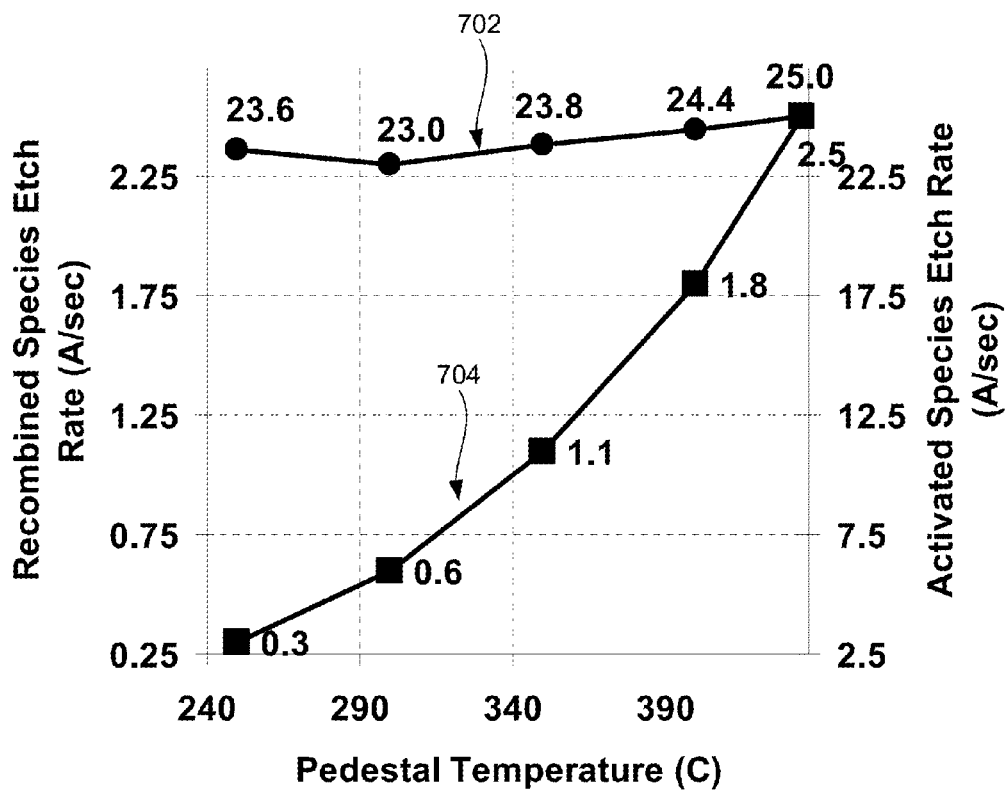
FIG. 7 is a plot of etching rates of activated fluorine species and recombined fluorine species as a function of the pedestal temperature.

FIG. 7 is a plot of two etching rates as a function of the pedestal temperature for activated species (line 702) and for recombined species (line 704). Etching tests were modeled using a nitrogen tri-fluoride precursor supplied into the processing chamber through a remote plasma generator at 400 sccm for 20 seconds (line 702) and a molecular fluorine precursor supplied at 500 sccm for 50 seconds (line 704). The chamber pressure was kept at 1 Torr during both tests. The results indicate that the etch rate corresponding to the recombined fluorine molecules (line 704) can be substantially reduced by lowering the pedestal temperature. At the same time, the etch rate corresponding to the activated species (line 702) remains relative flat, i.e., it is not as sensitive to the pedestal temperature as line 702.

In certain embodiments, it may be difficult to eliminate or even substantially minimize recombined species from contacting the substrate surface (e.g., to minimize recombination of activated species). For example, an apparatus typically include a showerhead (further explained in the context of FIG. 4), which causes substantial recombination of previously activated etchant species (e.g., flowing from a remote plasma generator through a showerhead). This may be a result, for example, of a longer residence time within an closed volume of the showerhead and its high surface-to-volume ratio. While recombination may be still present in the system, it has been determined that effect of recombined species of partial removal may be reduced by a substrate temperature during this operation. Atomic fluorine has much lower activation energy than molecular fluorine (0.33 eV v. 0.55 eV). This relationship generally holds for other activated and recombined species. As such, etching contributions of recombined species can be reduced by lowering temperature during the etching operation.

Another process parameter that may effect recombination of activated species is a pressure inside the chamber or, more specifically, partial pressures of different materials that may be present in the chamber (e.g., initial etchant materials, activated species, recombined species, carrier gases, reaction products, etc.). A higher total pressure (e.g., greater than about 10 Torr) generally corresponds to shorter mean free paths of the activated etchant species resulting in more collisions between the species, which in turn results in a higher recombination rate. Furthermore, it has been found that a sticking probability of some recombined species (e.g., molecular fluorine) on a tungsten surface or other similar surfaces is lower than that of activated species (e.g., atomic fluorine) at low pressure levels. A low sticking probability tends to improve step coverage.

Figure 8:
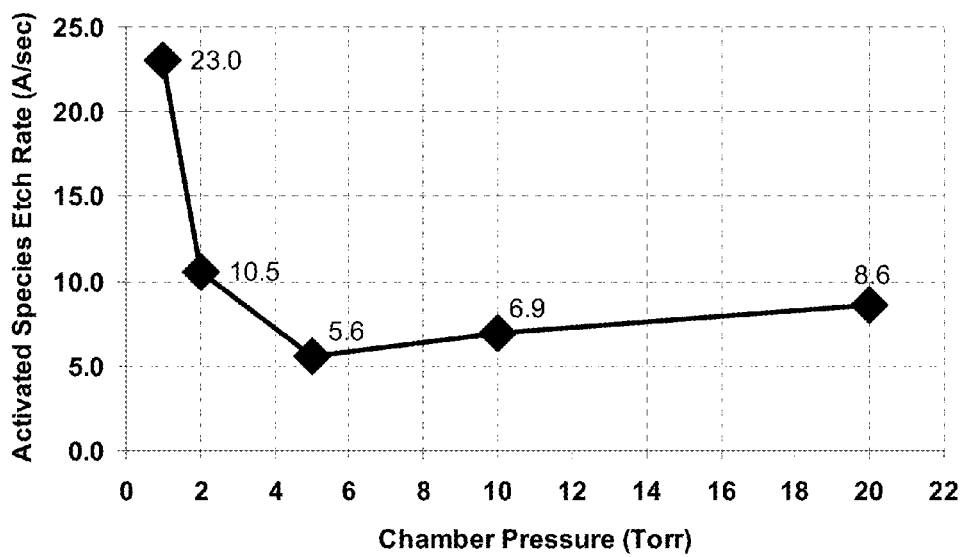
FIG. 8 is a plot of an etching rate of activated fluorine species as a function of the chamber pressure.

FIG. 8 is a plot of an etch rate as a function of the chamber pressure for a nitrogen tri-fluoride precursor supplied into the processing chamber at 400 sccm for 20 seconds. The substrate was kept at 300° C. during this experiment. The results show that between 1 Torr and 5 Torr an increase in pressure resulted in lower etching rates. Without being restricted to any particular theory, it is believed that higher pressures at this level leads to higher recombination rates of activated species into recombined species, which are less reactive leading to lower etching rates. This recombination and lower etching reactivity actually offsets any increases caused by higher overall etchant concentrations. As pressure further increased above 5 Torr, higher concentrations of etching materials results in some moderate increases in etching rates. It is believed that removal is predominantly controlled by the recombined species at this pressure levels. As such in order to have a greater contribution from activated species, a process chamber needs to be kept at lower overall pressure values. In certain embodiments, a process chamber is maintained at less than about 5 Torr, or more specifically at less than about 2 Torr, or even at less than about 1 Torr or less than about 0.1 Torr.

Returning to FIG. 2, the reduction in the average thickness of the deposited layer near the opening may be greater than that inside the feature as a result of the selective removal operation 205. In certain embodiments, the reduction near the opening is at least about 10% greater than the reduction inside the feature or, in more specific embodiments, is at least about 25% greater. The removal operation 205 may generally be performed up to the point at which the substrate or any underlayer, if one is present, is exposed to the etchant. The remaining layer may be characterized with step coverage. In certain embodiments, step coverage of the etched layer is at least about 75%, more specifically at least about 100%, or at least about 125%, more even more specifically at least about 150%.

In certain embodiments, the substrate may include one or more features that are closed during the deposition operation 203 and remain closed during the selective removal operation 205. For example, a substrate may include small, medium size, and large features. Some small features may close during the initial deposition operation and never open again. Medium size features may close during later cycles and remain closed while other larger features are being filled. In certain embodiments, features may be present at different vertical levels of the substrates, e.g., in a dual-damascene arrangements. The features on lower-levels may close earlier than features in higher-levels.

In certain embodiments, the deposition operation 203 may only temporarily close the feature. Unlike closing the feature during a final filling operation, such as operation 213 described below, or in the situation with multiple features of different sizes and vertical positions described above, the seam during this temporary closure may be still unacceptably large or start too close to the field region. In these embodiments, the selective removal operation 205 may be designed in such a way that the first part of the operation 205 is used to re-open the feature and then the next part of the operation 205 is used for selective removal of the deposited material. The process conditions in these two parts may be the same or different. For example, the etchant flow rate may be higher during the first part of the operation 205 and then decreased as the feature opens up.

A deposition-removal cycle including the deposition operation 203 and the selective removal operation 205 may be repeated one or more times as indicated by decision block 207. For example, it may be difficult to achieve desirable step coverage after one cycle, particularly, in small features with large overhangs. Considerations in a decision 207 whether to proceed with another cycle include overhang size, feature size, feature aspect ratio, feature bowing, as well as seam size and seam location requirements.

In certain embodiments, process parameters for one or both operations in the next cycle may be changed (block 209). For example, net deposition during initial cycles may need to be greater than in the later cycles because the deposited layer is still thin layer and the risk of contamination during etching is high. At the same time, the cavity is more open initially and the risk of closing is lower. For example, initial deposition cycles may be performed at slower deposition rates (e.g., driven by lower temperatures and/or chamber pressure) to achieve greater control over amounts of the tungsten containing materials deposited on the partially manufactured substrate. Slower rates may lead to a more conformal deposition as described above, which may be needed for certain feature types, in particular small, high aspect ratio features. Subsequent deposition cycles may be performed at faster deposition rates (e.g., driven by higher temperatures and/or chamber pressure) since control over a deposited thickness may be less critical and/or previous deposition-etching cycles may have already modified profiles of the cavities in such way that these cavities are less likely to close prematurely. In other embodiments, deposition operation in later cycles may be performed at slower deposition rated because remaining cavities are smaller and may be prone to premature closing. Likewise, etching process conditions may modified from one cycle to another starting, for example, with less aggressive etching conditions while deposited layers are still thin and eventually turning to more aggressive etching conditions.

Returning to FIG. 3, cross-section 331 depicts the feature after selective removal. Thus, cross-sections 321 and 331 may represent the first cycle or, more generally, one of the initial cycles. The deposited layer 323 during this cycle may be too thin to completely compensate for or offset various seam formation causes, such as the overhang 315. For example, after the selective removal operation the cavity shown in cross-section 331 is still narrower near the opening than inside the feature. In certain embodiments, this difference (how much narrower) may be sufficiently small that the process continues to a final filling operation without repeating the deposition-removal cycle.

Cross-sections 341 and 351 illustrate the substrate 303 during and after later cycles. First, cross-section 341 shows a new deposited layer 343 formed over etched layer 333. The feature with layer 343 may have an improved profile reflecting better step coverage achieved during the previous cycles. However, the profile of the cavity may still not allow proceeding to final filling and another etching operation may be needed to further shape this cavity. Cross-section 351 represents the substrate 303 at a stage prior to a final deposition to complete the fill. The cavity is wider near the opening than inside the cavity. In certain embodiments, step coverage of the new deposited layer is at least about 10% greater than that of the initially deposited layer or, in more specific embodiments, at least about 20% greater or at least about 30% greater.

Returning to FIG. 2, in certain embodiments, the deposition operation 203 and the selective removal operation 205 may be performed simultaneously, which is represented by a block 204. For example, a precursor and an etchant may be flown into the processing chamber at the same time allowing for both deposition and etching reactions to occur simultaneously. In order to achieve greater net deposition inside the feature than near the opening, at least initially, the flow rates of the etchant and the tungsten-containing precursor may be such that the etching reaction is mass-transport limited and, therefore, depends on the etchant concentration. At the same time, the deposition reaction is not mass-transport limited and proceeds at about the same rates inside the feature and the opening. An etchant or precursor flow rate or both may be adjusted (e.g., gradually or in stepwise fashion) during the operation 204, and at some point the etchant flow into the processing camber may be discontinued. At this point, the process may transition to a final fill operation 213 described below.

After one or more deposition-removal cycles are performed to partially fill the feature and shape the feature profile, the process may then continue with a final filling operation 213. This operation may be in some aspects similar to the deposition operation 203. The main distinction is that the operation 213 proceeds until the feature is completely closed and it is not followed by an etching operation to open the feature. Returning to FIG. 3, cross-section 361 represents an example of substrate 303 after the final filling operation. In certain embodiments, the feature still has a seam 363, but it is smaller and has a reference point positioned further away from the field region than in a conventionally filled feature, such as the one illustrated in FIG. 1. In certain embodiments, the seam 363 ends at least about 20% from the field region relative to the depth of the feature (i.e., a ratio of $D_{REF}$ to $D_{FET}$ is at least about 20%).

In another embodiment, features are filled by depositing more tungsten inside the features than near the opening. Differential deposition rates may be achieved by inhibiting a surface onto which tungsten-containing materials are being deposited to different levels depending on the position within the feature (e.g., near the opening or inside the feature). Specifically, the surface near the opening may be inhibited more than the surface inside the feature. In a particular embodiment, an inhibitor is introduced into the processing chamber before a deposition operation. The exposed surface of the feature is treated with this inhibitor in a mass-transport limited regime similar to the one described above in the context of etching. However, unlike the etching operation no material is removed from the surface (i.e., no net etch) during inhibiting. For example, at certain process conditions fluorine-based etching of the deposited layer may lead to formation of residues (e.g., containing certain tungsten fluorides) on the surface of the remaining etched layer. These residues may act as an inhibitor in a subsequent deposition operation. Further, at certain process conditions no net removal of materials from the deposited layer may occur, but the deposited layer forms an inhibiting layer that is more prevalent near the opening than inside the feature. Filling the feature using differential deposition rates as may be done in conjunction with or in lieu of the deposition-removal operations described above.

Apparatus

Any suitable chamber may be used to implement this novel method. Examples of deposition apparatuses include various systems, e.g., ALTUS and ALTUS Max, available from Novellus Systems, Inc. of San Jose, Calif., or any of a variety of other commercially available processing systems.

Figure 4:
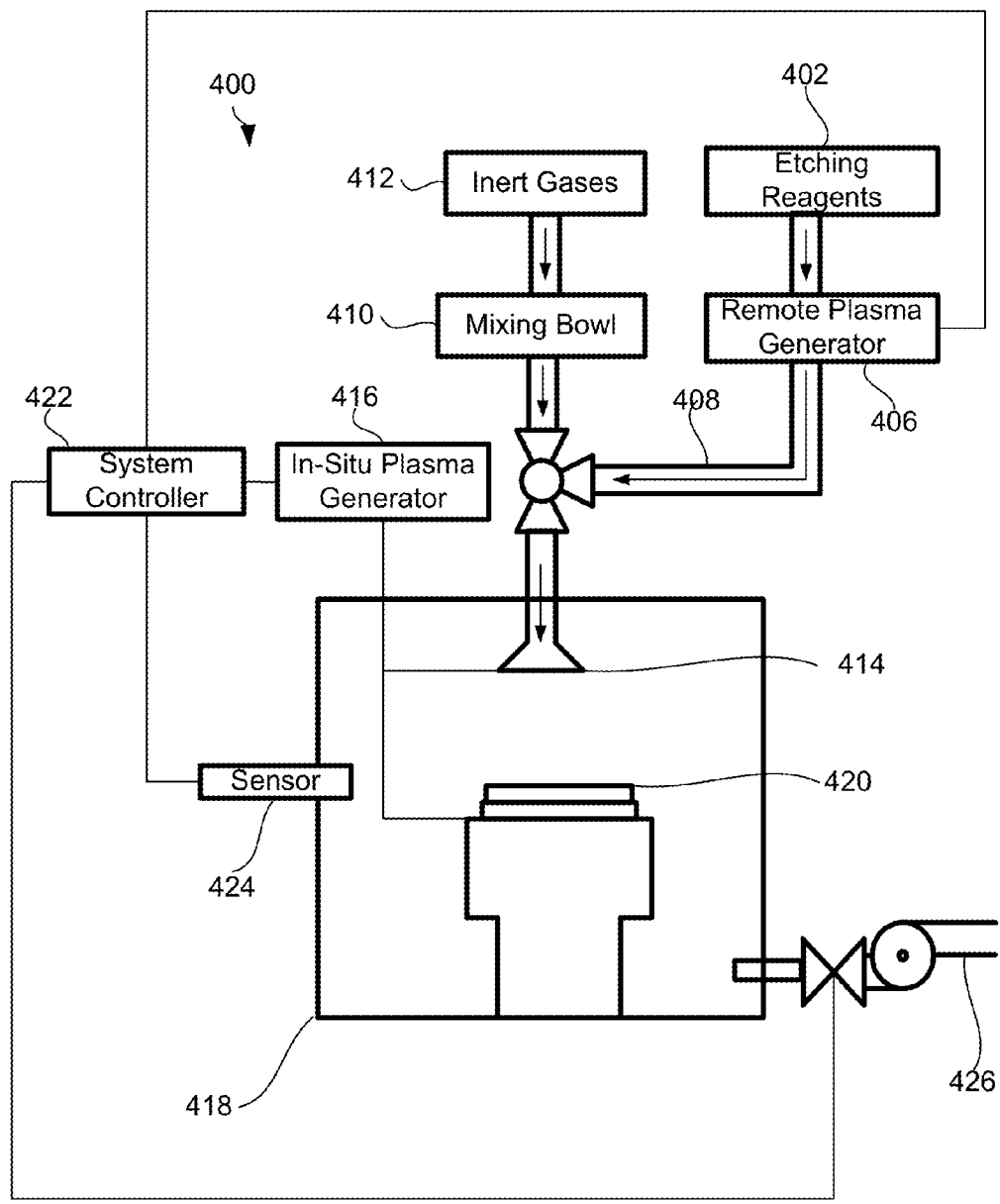
FIG. 4 illustrates a schematic representation of an apparatus, in accordance with certain embodiments, for filling high aspect ratio features.

FIG. 4 illustrates a schematic representation of an apparatus 400 for processing a partially fabricated semiconductor substrate in accordance with certain embodiments. The apparatus 400 includes a chamber 418 with a pedestal 420, a shower head 414, and an in-situ plasma generator 416. The apparatus 400 also includes a system controller 422 to receive input and/or supply control signals to various devices.

The etchant and, in certain embodiments, inert gases, such as argon, helium and others, are supplied to the remote plasma generator 406 from a source 402, which may be a storage tank. Any suitable remote plasma generator may be used for activating the etchant before introducing it into the chamber 418. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied etchant. Imbedded into the RPC unit a high power RF generator provides energy to the electrons in the plasma. This energy is then transferred to the neutral etchant molecules leading to temperature in the order of 2000K causing thermal dissociation of these molecules. An RPC unit may dissociate more than 60% of incoming etchant molecules because of its high RF energy and special channel geometry causing the etchant to adsorb most of this energy.

In certain embodiments, an etchant is flown from the remote plasma generator 406 through a connecting line 408 into the chamber 418, where the mixture is distributed through the shower head 414. In other embodiments, an etchant is flown into the chamber 418 directly completely bypassing the remote plasma generator 406 (e.g., the system 400 does not include such generator). Alternatively, the remote plasma generator 406 may be turned off while flowing the etchant into the chamber 418, for example, because activation of the etchant is not needed.

The shower head 414 or the pedestal 420 typically may have an internal plasma generator 416 attached to it. In one example, the generator 416 is a High Frequency (HF) generator capable of providing between about 0 W and 10,000 W at frequencies between about 1 MHz and 100 MHz. In a more specific embodiment, the HF generator may deliver between about 0 W to 5,000 W at about 13.56 MHz. The RF generator 416 may generate in-situ plasma to enhance removal of the initial tungsten layer. In certain embodiments, the RF generator 416 is not used during the removal operations of the process.

The chamber 418 may include a sensor 424 for sensing various process parameters, such as degree of deposition and etching, concentrations, pressure, temperature, and others. The sensor 424 may provide information on chamber conditions during the process to the system controller 422. Examples of the sensor 424 include mass flow controllers, pressure sensors, thermocouples, and others. The sensor 424 may also include an infra-red detector or optical detector to monitor presence of gases in the chamber and control measures.

Deposition and selective removal operations generate various volatile species that are evacuated from the chamber 418. Moreover, processing is performed at certain predetermined pressure levels the chamber 418. Both of these functions are achieved using a vacuum outlet 426, which may be a vacuum pump.

In certain embodiments, a system controller 422 is employed to control process parameters. The system controller 422 typically includes one or more memory devices and one or more processors. The processor may include a CPU or computer, analog and/or digital input/output connections, stepper motor controller boards, etc. Typically there will be a user interface associated with system controller 422. The user interface may include a display screen, graphical software displays of the apparatus and/or process conditions, and user input devices such as pointing devices, keyboards, touch screens, microphones, etc.

In certain embodiments, the system controller 422 controls the substrate temperature, etchant flow rate, power output of the remote plasma generator 406, pressure inside the chamber 418 and other process parameters. The system controller 422 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, etchant flow rates, etc. These parameters are provided to the user in the form of a recipe, and may be entered utilizing the user interface. Signals for monitoring the process may be provided by analog and/or digital input connections of the system controller 422. The signals for controlling the process are output on the analog and digital output connections of the apparatus 400.

Multi-Station Apparatus

Figure 5A:
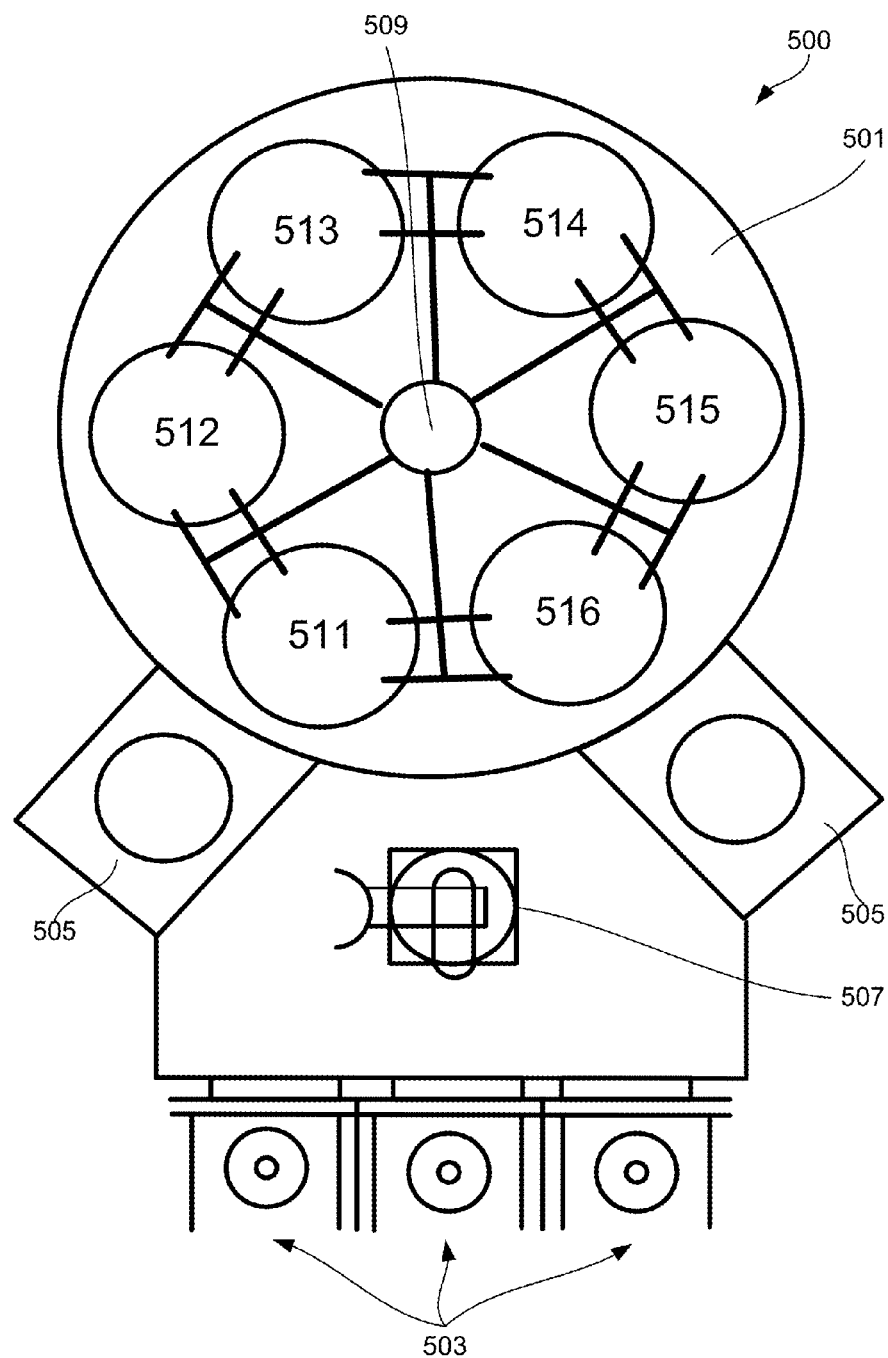
FIG. 5A shows a schematic illustration of a multi-station apparatus, in accordance with certain embodiments, for filling high aspect ratio features.

FIG. 5A shows an example of a multi-station apparatus 500. The apparatus 500 includes a process chamber 501 and one or more cassettes 503 (e.g., Front Opening Unified Ports) for holding substrates to be processed and substrates that have completed processing. The chamber 501 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 5A illustrates the process chamber 501 that includes six stations, labeled 511 through 516. All stations in the multi-station apparatus 500 with a single process chamber 503 are exposed to the same pressure environment. However, each station may have a designated reactant distribution system and local plasma and heating conditions achieved by a dedicated plasma generator and pedestal, such as the ones illustrated in FIG. 4.

A substrate to be processed is loaded from one of the cassettes 503 through a load-lock 505 into the station 511. An external robot 507 may be used to transfer the substrate from the cassette 503 and into the load-lock 505. In the depicted embodiment, there are two separate load locks 505. These are typically equipped with substrate transferring devices to move substrates from the load-lock 505 (once the pressure is equilibrated to a level corresponding to the internal environment of the process chamber 503) into the station 511 and from the station 516 back into the load-lock 505 for removal from the processing chamber 503. An internal robot 509 is used to transfer substrates among the processing stations 511-516 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIG. 4. For example, a station 511 may receive a substrate from a load-lock and be used to pre-heat the substrate before being further processed. Other stations may be used for filling high aspect ratio features including deposition and selective removal operations.

After the substrate is heated or otherwise processed at the station 511, the substrate is moved successively to the processing stations 512, 513, 514, 515, and 516, which may or may not be arranged sequentially. The multi-station apparatus 500 is configured such that all stations are exposed to the same pressure environment. In so doing, the substrates are transferred from the station 511 to other stations in the chamber 501 without a need for transfer ports, such as load-locks.

The internal robot 509 is used to transfer substrates between stations 511-516. The robot 509 includes a fin with at least one arm for each processing station (shown extending between stations). At the end of the arm adjacent to the processing stations are four fingers that extend from the arm with two fingers on each side. These fingers are used to lift, lower, and position a substrate within the processing stations. For example, in one embodiment, where the multi-station apparatus includes six processing stations, the spindle assembly is a six arm rotational assembly with six arms on one fin. For example, as shown in the drawings the fin of the spindle assembly includes six arms, with each arm having four fingers. A set of four fingers, i.e., two fingers on a first arm and two fingers on an adjacent, second arm, are used to lift, position and lower a substrate from one station to another station. In this manner, the apparatus is provided with four fingers per pedestal, per station and per substrate.

In certain embodiments, one or more stations may be used to fill features with tungsten-containing materials. For example, stations 512 may be used for an initial deposition operation, station 513 may be used for a corresponding selective removal operation. In the embodiments where a deposition-removal cycle is repeated, stations 514 may be used for another deposition operations and station 515 may be used for another partial removal operation. Section 516 may be used for the final filling operation. It should be understood that any configurations of station designations to specific processes (heating, filling, and removal) may be used.

As an alternative to the multi-station apparatus described above, the method may be implemented in a single substrate chamber or a multi-station chamber processing a substrate(s) in a single processing station in batch mode (i.e., non-sequential). In this aspect of the invention, the substrate is loaded into the chamber and positioned on the pedestal of the single processing station (whether it is an apparatus having only one processing station or an apparatus having multi-stations running in batch mode). The substrate may be then heated and the deposition operation may be conducted. The process conditions in the chamber may be then adjusted and the selective removal of the deposited layer is then performed. The process may continue with one or more deposition-removal cycles and with the final filling operation all performed on the same station. Alternatively, a single station apparatus may be first used to perform only one of the operation in the new method (e.g., depositing, selective removal, final filling) on multiple wafers after which the substrates may be returned back to the same station or moved to a different station (e.g., of a different apparatus) to perform one or more of the remaining operations.

Multi-Chamber Apparatus

Figure 5B:
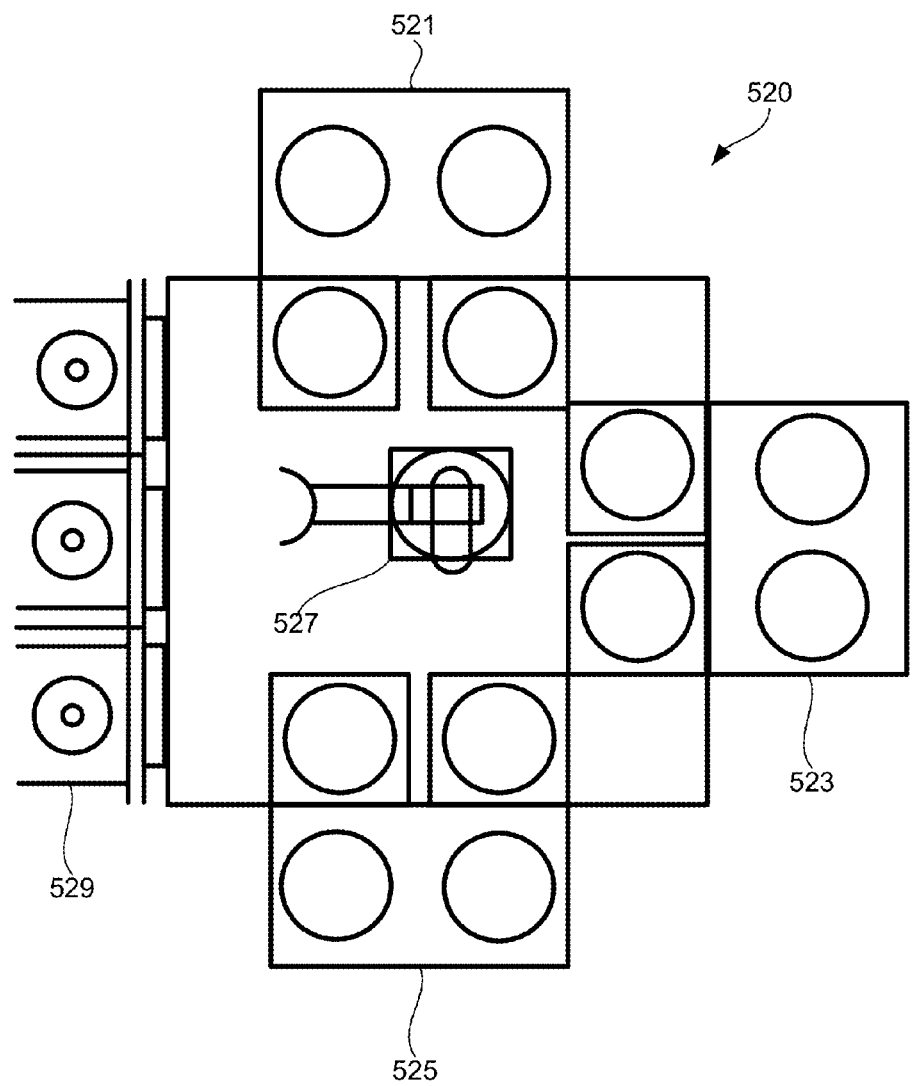
FIG. 5B is a schematic illustration of a multi-chamber apparatus, in accordance with certain embodiments, for filling high aspect ratio features.

FIG. 5B is a schematic illustration of a multi-chamber apparatus 520 that may be used in accordance with certain embodiments. As shown, the apparatus 520 has three separate chambers 521, 523, and 525. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 521-525 has its own pressure environment, which is not shared between chambers. Each chamber may have one or more corresponding transfer ports (e.g., loadlocks). The apparatus may also have a shared substrate handling robot 527 for transferring substrates between the transfer ports one or more cassettes 529.

As noted above, separate chambers may be used for depositing tungsten containing materials and selective removal of these deposited materials in later operations. Separating these two operations into different chambers can help to substantially improve processing speeds by maintaining the same environmental conditions in each chamber. In other words, a chamber does not need to change its environment from conditions used for deposition to conditions used for selective removal and back, which may involve different precursors, different temperatures, pressures, and other process parameters. In certain embodiments, it is faster to transfer partially manufactured semiconductor substrates between two or more different chambers than changing environmental conditions of these chambers.

Experimental

A series of experiments were conducted to determine effects of different process conditions on selective removal of the deposited materials and resulting seam. It was found that increasing a substrate temperature and reducing an etchant flow rate can lead to mass-transport limited etching inside the feature resulting in more material etched away near the opening than inside the feature.

In one experiment, different etching conditions and their effects on step coverage were evaluated. Substrates with features that have openings of approximately 250 nanometers in cross-section and an aspect ratio of approximately 10:1 were used. The features were first partially filled with tungsten at about 395° C. substrate temperature, about 200 sccm flow rate of the tungsten fluoride ($WF_6$) in argon and hydrogen environment. Several substrates were then cross-sectioned in order to analyze tungsten distribution within the features. It was found that the layer was slightly thinner inside the features (about 862 Angstroms thick on average) than around the openings (about 639 Angstroms thick on average) leading to step coverage of about 62%.

The remaining substrates were divided into two groups. Substrates in the first group were etched using reference process conditions: a chamber pressure of approximately 8 Torr, a substrate temperature of approximately 350° C., a flow rate of nitrogen tri-fluoride (NF3) of approximately 2,000 sccm, and etching duration of approximately 4 seconds. Several substrates from this group were cross-sectioned after the etching to further analyze tungsten distribution within the features. It was determined that the opening thickness (a thickness of the tungsten layer near the opening) was on average about 497 Angstroms, while the inside thickness was on average about 464 Angstroms, for a step coverage of about 107%.

The second group of wafers was etched using different ("improved") process conditions. These new conditions were believed to push the etching inside the feature into the mass-transport limited regime and, thus, improve the step coverage even more. The substrate temperature was increased to approximately 395° C., while the etchant flow rate was reduced to approximately 400 sccm. The etching was performed in a chamber maintained at about 2 Torr for approximately 12 seconds. The remaining etched layer was significantly thicker inside the features (about 555 Angstroms thick on average) than near the openings (about 344 Angstroms thick on average). The calculated step coverage is about 161%.

Figure 6A:
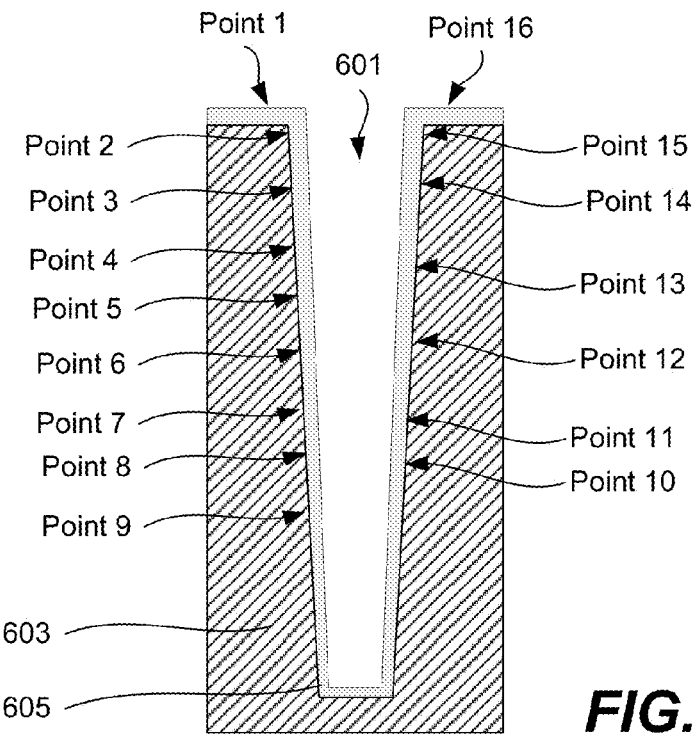
FIG. 6A illustrates a schematic representation of a feature provided in a partially manufactured semiconductor substrate with a tungsten-containing layer deposited in the feature and specifies different points of measurements of the layer thickness.
Figure 6B:
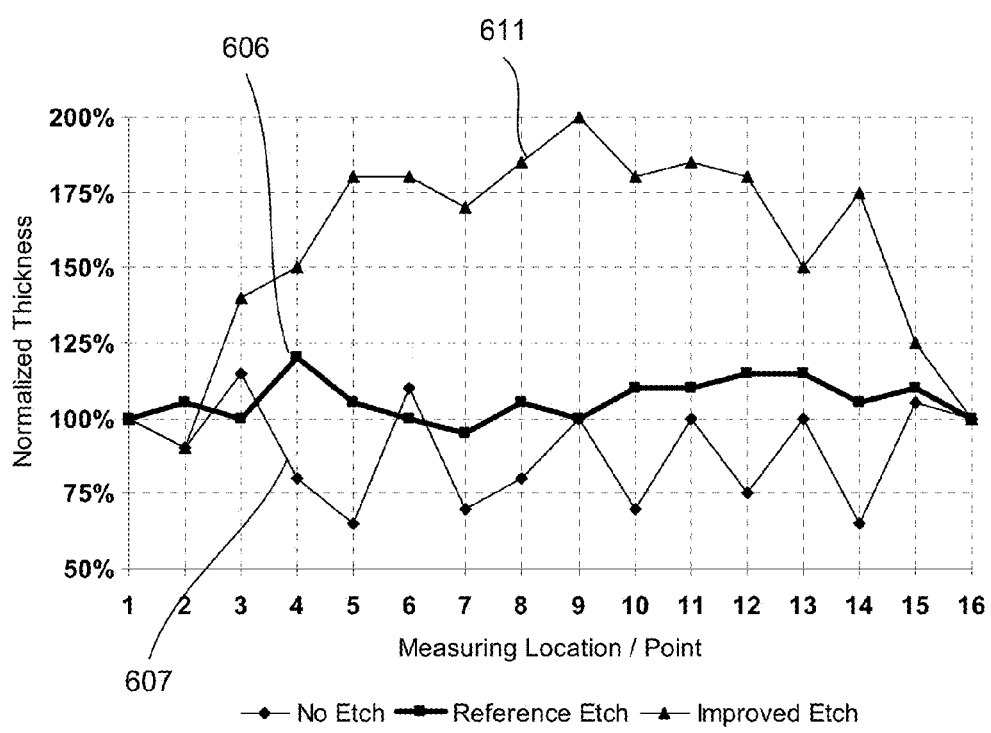
FIG. 6B illustrates a graph of the thickness distribution of the tungsten-containing layer shown in FIG. 6A before etching and after etching for two different process conditions.

FIG. 6A illustrates a schematic representation of a feature 601 provided in a partially manufactured semiconductor substrate 603 with a tungsten-containing layer 605 formed with the feature 601 similar to the one used in the above experiment. The figure also specifies different points of measurements of the layer thickness. FIG. 6B illustrates a graph of the thickness distribution of the tungsten-containing layer for the experiment described above before etching and after etching for two different process conditions. The horizontal axis of this graph corresponds to the measuring points illustrated in FIG. 6A. Thickness values provided in the graph are normalized to the respective values on the field region (points 1 and 16). The bottom thin line 607 represents thickness distribution within the feature prior to any etching. This line indicates that the layer is generally slightly thinner inside the feature than near the opening after deposition. The middle thick line 609 represents thickness distribution for the substrates etched with the reference etching conditions. This distribution indicates slightly greater step coverage than the one represented by the line 607. Finally, the top thin line 611 represents distribution of tungsten that was etched using the "improved" conditions. It reveals substantially improved step coverage. The thickness at the lowest (deepest) measured points (points 8, 9, and 10, which were approximately 30-40% of the feature's depth from the feature's bottom), is almost twice greater than the thickness near the field region (points 1, 2, 15, and 16).

Conclusion

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A method of filling a high aspect ratio feature provided on a partially manufactured semiconductor substrate, the feature having an opening and an interior, the method comprising:
    introducing a tungsten-containing precursor and a reducing agent into a processing chamber;
    depositing a layer of a tungsten-containing material on the partially manufactured semiconductor substrate via a chemical vapor deposition reaction between the tungsten-containing precursor and the reducing agent, such that the layer partially fills the high aspect ratio feature;
    flowing an etching material into the processing chamber to contact the substrate; and
    selectively removing a portion of the deposited layer using the etching material at process conditions including a substrate temperature of less than about 250° C. and a pressure processing chamber pressure of less than 5 Torr such that more tungsten is removed near the feature opening than in the feature interior, wherein the etching material that contacts the substrate includes atomic fluorine and molecular fluorine, and wherein the amount of the deposited layer removed by atomic fluorine is at least ten times greater than the amount of the deposited layer that is removed by molecular fluorine.

2. The method of the claim 1, wherein the temperature of the partially manufactured semiconductor substrate is less than about 150° C.

3. The method of the claim 1, wherein the temperature of the partially manufactured semiconductor substrate is less than about 100° C.

4. The method of the claim 1, wherein the pressure of the processing chamber is less than 2 Torr.

5. The method of the claim 1, wherein the pressure of the processing chamber is less than 1 Torr.

6. The method of claim 1, wherein a reduction in a thickness of the deposited layer near the opening of the high aspect ratio feature is at least about 25% greater than inside the high aspect ratio feature.

7. The method of claim 1, wherein the high-aspect ratio feature has an aspect ratio of at least about 2.

8. The method of claim 1, wherein removing the portion of the deposited layer is performed in a mass transport limited regime.

9. The method of claim 1, wherein the etching material is introduced into the processing chamber from a remote plasma generator configured to generate activated etching material from an initial etching material.

10. The method of claim 1, further comprising repeating the deposition operation to form a second deposited layer and repeating the selective removal operation to form a second etched layer.

11. The method of claim 10, wherein the repeated selective removal operation is performed at different process conditions than the prior selective removal operation.

12. The method of claim 10, wherein a reduction in a thickness of the second deposited layer near an opening of the high aspect ratio feature is greater than inside the high aspect ratio feature by at least about 10%.

13. The method of claim 1, further comprising depositing the tungsten-containing material on the partially manufactured semiconductor substrate via the chemical vapor deposition reaction between the tungsten-containing precursor and the reducing agent until the high aspect ratio feature is closed.

14. The method of claim 13, wherein the closed high aspect ratio feature has a seam that ends at least about 20% from a field region relative to the depth of the high aspect ratio feature.

15. The method of claim 1, wherein the deposition operation and the selective removal operation are performed in different chambers maintained at different environmental conditions.

16. The method of claim 1, wherein the partially manufactured semiconductor substrate has a second feature that is closed during the deposition operation and remains closed after the selective removal operation.

17. The method of claim 1, wherein the high aspect ratio feature is closed during the deposition operation and opens during the selective removal operation.

18. The method of claim 1, wherein the selective removal is performed at process conditions where the removal rate is substantially constant with respect to temperature.

19. The method of claim 1, wherein the removal contribution of activated species of the activated etching material exceeds that of recombined species of the activated etching material.

20. A method of filling a high aspect ratio feature provided on a partially manufactured semiconductor substrate, the method comprising:
    depositing in a first processing chamber a layer of a tungsten-containing material on the partially manufactured semiconductor substrate via a chemical vapor deposition reaction between a tungsten-containing precursor and a reducing agent, such that the layer partially fills the high aspect ratio feature;
    moving the partially manufactured semiconductor substrate with the deposited layer of the tungsten-containing material into a second processing chamber, wherein the second processing chamber has different environmental conditions than the first processing chamber;
    selectively removing in the second processing chamber a portion of the deposited layer using an etching material to form an etched layer at process conditions that substantially prevent recombination of the etching material such that a thickness of the etched layer near an opening of the high aspect ratio feature is less than inside the high aspect ratio feature, wherein removing is performed while the second processing chamber is kept at less than about 5 Torr and the partially manufactured semiconductor substrate is kept at less than about 250° C., wherein the etching material includes atomic fluorine and molecular fluorine, and wherein the amount of the deposited layer removed by atomic fluorine is at least ten times greater than the amount of the deposited layer that is removed by molecular fluorine; and depositing an additional tungsten-containing material over the etched layer until the high aspect ratio feature is closed.

21. A semiconductor processing apparatus for filling a high aspect ratio feature provided on a partially manufactured semiconductor substrate, the apparatus comprising:
- a first processing chamber having one or more deposition stations for positioning the substrate, said first processing chamber configured to deposit a layer of a tungsten-containing material on the partially manufactured semiconductor substrate via a chemical vapor deposition reaction, said one or more deposition stations comprising a deposition heating element for controlling a temperature of the substrate during deposition;
- a second processing having one or more etching stations for positioning the substrate, said second processing chamber configured to selectively remove a portion of the deposited layer, said one or more etching stations comprising an etching heating element for controlling the temperature of the substrate during etching; and
- a controller comprising program instructions for:
  - depositing the layer of the tungsten-containing material on the partially manufactured semiconductor substrate via the chemical vapor deposition reaction between a tungsten-containing precursor and a reducing agent, such that the layer partially fills the high aspect ratio feature;
  - flowing an etching material in the second processing chamber; and
  - selectively removing a portion of the deposited layer using the etching material at process conditions including a substrate temperature of less than about 250° C. and a pressure processing chamber pressure of less than 5 Torr, wherein the etching material includes atomic fluorine and molecular fluorine, and wherein the amount of the deposited layer removed by atomic fluorine is at least ten times greater than the amount of the deposited layer that is removed by molecular fluorine.

* * * * *